United States Patent [19]

Harrington, III

[11] Patent Number: 4,950,620
[45] Date of Patent: Aug. 21, 1990

[54] PROCESS FOR MAKING INTEGRATED CIRCUIT WITH DOPED SILICON DIOXIDE LOAD ELEMENTS

[75] Inventor: Thomas E. Harrington, III, Carrollton, Tex.

[73] Assignee: Dallas Semiconductor Corp., Dallas, Tex.

[21] Appl. No.: 252,268

[22] Filed: Sep. 30, 1988

[51] Int. Cl.⁵ .......................................... H01L 21/265
[52] U.S. Cl. ........................................ 437/60; 437/46; 437/47; 437/52; 437/228; 437/918; 357/51
[58] Field of Search .................... 437/47, 52, 60, 918, 437/16, 46, 228; 357/51; 198/DIG. 136; 29/610 R; 365/188

[56] References Cited

U.S. PATENT DOCUMENTS

| | | | |
|---|---|---|---|
| 3,922,708 | 11/1975 | Crowder | 357/51 |
| 4,406,051 | 9/1983 | Lizuka | 357/51 |
| 4,575,923 | 3/1986 | Arnold | 437/918 |
| 4,755,480 | 7/1988 | Yau et al. | 357/51 |

FOREIGN PATENT DOCUMENTS

| | | | |
|---|---|---|---|
| 0122659 | 10/1987 | European Pat. Off. | 437/918 |
| 120549 | 6/1985 | Japan | 437/51 |

OTHER PUBLICATIONS

News Item which appeared in the Sep. 1988 issue of *Semiconductor International* (entire text of article included in Information Disclosure Statement).

*Primary Examiner*—Brian E. Hearn
*Assistant Examiner*—T. Thomas

[57] ABSTRACT

An integrated circuit which uses vertical current flow through arsenic-implanted oxide films to provide low-current loads. These load elements provide a compact four-transistor SRAM which has very simple fabrication and very low power consumption.

27 Claims, 3 Drawing Sheets

PROCESS FOR MAKING INTEGRATED CIRCUIT WITH DOPED SILICON DIOXIDE LOAD ELEMENTS

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extend that the copyright owner has no objection to the facsimile reproduction by anyone of the patent document or patent disclosure, as it appears in the U. S. Patent and Trademark Office patent file or records, but otherwise reserves all copyright rights whatsoever.

BACKGROUND AND SUMMARY OF THE INVENTION

The present invention relates to integrated circuits, and to the provision of the load elements in integrated circuits. More particularly, the present invention relates to low-power integrated circuits, and to low-power static RAM access memories (SRAM's).

In integrated circuits generally, it is necessary to be able to change the voltages of nodes in two directions. For example, in conventional CMOS logic, p-channel insulated gate field effect transistors (PMOS devices) are used to pull up the voltage of a node, and NMOS devices are used to pull down the voltage of a node. In conventional NMOS logic, NMOS devices are used to pull down nodes, and resistor loads are used to pull up the nodes.

A specific example of this is in SRAMs (static random access memories). In a conventional CMOS SRAM, six transistors are used in each cell. The cell has two data nodes, which have opposite logic states. Each node is connected to ground through an NMOS driver transistor. The driver transisitor which connects each node to ground has its gate connected to the opposite data node so that, when one data node goes high, it will pull the opposite data load low by turning on its driver transistor. Similarly, each node is connected, through a PMOS pull-up transistor, to the high supply voltage $V_{DD}$ (which is typically 5 volts). Again, the data nodes are connected to control the pull-up transistors of the opposite data node, so that, when one of the data nodes goes low, it will turn on the pull up transistor of the opposite node, so that the opposite node is held high. In addition, two pass transistors (normally NMOS transistors) selectively connect the two data nodes to a pair of bit lines. (The gates of the pass transistors are connected to a word line, so that the cell nodes will be connected to the bit line pair only if the word line goes high.) Such a 6-transistor cell will hold its logic state indefinitely (as long as the supply voltages are maintained and no transient upset occurs). Moreover, while such a cell is simply holding data, it has almost zero power consumption, since each of the nodes will be disconnected from one of the two power supply voltages.

The low power consumption of CMOS is extremely advantageous in a wide variety of environments, and is one of the reasons why CMOS logic has become very widely used for a wide variety of digital circuits. Low power consumption is not only advantageous where the total drain on system power supply must be conserved (as, for example, in applications where the power is being supplied from a battery), but also implies that the on-chip power dissipation will be less. This can be important in a wide variety of applications where a very high density is required.

However, while conventional CMOS logic has some major advantages, it also has significant disadvantages. The use of both PMOS and NMOS devices means that additional masking and doping steps must be used to provide both n-type device areas (for the PMOS devices) and p-type device areas (for the NMOS active devices). Moreover, for a given device area, the use of both PMOS and NMOS active devices means that some new spacing constraints must be observed. An important spacing constraint is imposed by the need to avoid latchup.

Latchup is a failure mode to which conventional bulk CMOS devices are inherently susceptible. A parasitic thyristor exists wherever an N+ source/drain region in the p- well of an NMOS device is close to a P+ source/drain region in the n- well of a PMOS device. The N+ source/drain, the P-well, the N-well, and the P+ source/drain of the PMOS device define a PNPN parasitic thyristor structure. In many locations, an n+ region will be connected to the positive power supply $V_{DD}$ and the nearest p+ will be connected to ground. Thus, if the parasitic thyristor fires, it can conduct a large amount of current. This can provide a stuck logic state, or even destroy the device.

An immense amount of effort has been devoted to reducing the propensity of CMOS devices to latchup, and some CMOS process produce devices with reduced susceptibility to latchup. However, for any conventional bulk CMOS process, a certain minimum P+ to N+ separation must be observed, to prevent the possibility of latchup.

Thus, an inherent limitation of conventional CMOS technology is that some space is lost at the interface between PMOS and NMOS active device regions. This constraint is particularly inconvenient in memory design. In the conventional 6-transistor CMOS SRAM cell described above, the transistor types require that a P-well/N-well boundary must run through every single memory cell in the array.

NMOS static random access memory cells tend to be more compact than PMOS static random access memory cells, because they do not require a P-well/N-well boundary within the cell. However, the static power consumption of NMOS memory cells is much larger than for CMOS memory cells. This is because current will flow through at least one of the load resistors all the time.

During normal operating conditions, the current provided by the load resistors only needs to be large enough to compensate for junction leakage. With normal high-quality processing techniques, this junction leakage will be substantially less than a picoAmpere per cell, and may range down to values in the neighborhood of one femtoAmpere ($10^{-15}$ Ampere) per cell. The highest-resistivity material conventionally available in integrated circuit processing is intrinsic polysilicon. While this material has very high bulk resitivity, it is difficult to fabricate it with a sheet resistance higher than a few hundred gigohms per square. This means that the largest resistor value which can be conveniently placed within a memory cell layout (without expanding the cell) will be about one teraohm. A one-teraohm resistor will pass a current, at 5 Volts, of 5 picoamps. Therefore, this resistor value is still several times smaller than would be desirable for low-power applications.

Other attempts to make compact high-value resistors have used oxygen implantation into polysilicon. However, such process approaches require the use of quite unusual process steps.

The present invention provides a novel load element for integrated circuits. This load element is a very high-impedance compact vertical resistance. This resistance readily provides a very compact load element, which can provide a sub picoAmpere current.

A further advantageous teaching of the present application is a novel SRAM cell, wherein very -high-impedance doped oxide load elements are used to provide a 4-transistor SRAM cell with very low standby current (less than a picoAmpere). Thus, this cell provides extremely high power efficiency, while also providing compact layout.

A particular advantage of this doped-oxide resistance element is that its temperature dependence closely tracks the temperature dependence of the junction leakage in the integrated circuit. Thus, areas can be selected so that the current passed by the load elements is greater than the leakage current at every operating temperature, but the current passed by the load elements is small enough that battery energy is well conserved. (Minimization of load current is driven by the demands of battery lifetime. As long as the specification for battery lifetime can be met, increased pull-up current will help the electrical operation of the cell). The static power consumption of a full-CMOS device (six-transistor cell) will be defined by the leakage current in any case, so it may be seen that the SRAM provided by the present invention can actually achieve power dissipation levels which are reasonably close to those of a full-CMOS SRAM using 6-transistor cells.

The innovative load used in the SRAM of the present invention will not be slower than an analogous six-transistor cell. In fact, if desired, some of the area savings provided by the compact load element can be used to enlarge the driver and pass transistors, so that an SRAM according to the present invention can be made faster than a full-CMOS SRAM of comparable dimensions and technology.

A further advantage of the SRAM of the present invention is that it can be compactly laid out in a single-polysilicon, single-metal configuration. This means that fabrication costs can be drastically reduced over the double-polysilicon and double-metal technologies commonly used. This in turn means that yield can be increased. While this configuration is somewhat slower than embodiments using double-level metal, its advantages may make it preferable for some applications.

Note also that the fabrication process is much simpler than that of conventional DRAM processing. DRAM processing normally requires the use of charge pumps and (at the 1M (one megabit) level and above) of trench processing. Thus, DRAM process development has increasingly diverged from the processing used for general-purpose digital circuits. This process divergence has contributed to the high cost of entry into the DRAM manufacturing business. By contrast, the SRAM provided by the innovative teachings herein is not only compatible with standard logic processing (requiring only one additional masking and implantation step), but can actually be made simpler than standard logic processing (since functional and compact SRAMs can be made with a single-poly single-metal process). This means that, by using the innovative teachings set forth herein, companies wishing to manufacture low-cost memory can easily begin to manufacture SRAMs.

The lowest-cost (mass-market) SRAMs have typically had access times which are less than those of the fastest mass-market DRAMs by about 30–50%. The increasing speeds of advanced commercial microprocessors have made this access time more relevant, since (for example) a 20 MHz microprocessor can typically access a 40 nsec SRAM in one cycle of the processor's internal clock, but an 85 nsec DRAM will require at least tow clock cycles. Moreover, SRAMs are much more convenient for system designers, because they do not require refreshing. However, even the lowest-cost SRAM chips have normally had a substantially higher cost per bit than DRAMs.

A recent trend in the design of small computers (such as those built around an 80386 microprocessor) has been to use SRAM rather than DRAM chips for main memory. Notwithstanding the high cost of SRAMs, their advantages have led to such use in high-end personal computers. Thus, the SRAM described herein may also be particularly advantageous for applications where SRAMs are competing with DRAMs for system design. The present invention provides a cost-per-bit which is much lower than that of the traditional SRAM process, and much closer to that of a DRAM.

Of course, memory cells do not have to be used only in memory parts. Microprocessors (and other complex logic parts) commonly contain substantial quantities of memory. The present invention provides a very low-power compact memory array, and blocks of memory of this kind can readily be inserted into the design of a complex logic part. A particular advantage of the disclosed single-poly, single metal layout is that the space over this memory cell can readily be used, in complex logic parts, for routing lines in second-level metal. Similarly, in triple-poly processes, it may be possible to route lines in third poly right over the memory array.

The innovative load element described herein can also be used in non-memory circuits in a wide variety of other integrated circuit devices, including analog integrated circuits and various random-logic digital circuits.

Preferably this improved high-impedance load device is used in combination with a full CMOS process. This means that the compact load can be used in locations where high pull-up current is not necessary, and PMOS active devices can be used in other locations. For example, in the SRAM provided by the presently preferred embodiment, the peripheral logic is full-CMOS, i.e. uses PMOS active devices for pull-up (e.g. for bit line precharge and in buffers).

The present invention also disclosed a novel method for fabricating doped-oxide loads of this type. In this novel method, a polysilicon capping level is deposited over the oxide before it is implanted. This capping level of polysilicon means that the implant energy can be selected so that the peak of the implant falls in the middle of the oxide, and yet the peak of the implant distribution is a fairly broad peak. (This is, the straggle of the implant is caused to be reasonably high.) Thus, sharp gradients in conductivity do not occur within the small thickness of the oxide.

Another novel teaching of the present application is that a gate oxide is preferably used for the doped oxide conductor. This gate oxide is formed, using methods well known to those in the MOS art, to have a very high purity and high quality microstructure. This means that the qualities of this oxide can be very closely controlled. In alternative embodiments, an oxide over polysilicon can be used to provide a poly-to-poly resistor, but this is less preferable.

The use of gate oxide and a polysilicon capping layer has the further advantage that the tail of the implant which dopes the oxide will also dope the substrate. This assures a low contact resistance between the resistor and the substrate.

An SRAM cell which has such a high-impedance load may be more susceptible to single event upset than a 6-transistor CMOS SRAM cell. However, the SRAM provided by the present invention will be no worse in this respect than a conventional DRAM cell.

Single-event upset is normally caused when a particle of ionizing radiation (for example, an alpha particle) is absorbed by the integrated circuit. As the particle passes through the substrate, it will generate a flow of electron-hole pairs. These carriers will diffuse to all parts of the integrated circuit, so that logic states which are stored as charged packets in the substrate will be lost.

The SRAM cell provided by the present invention has dimensions which are more than 40% smaller than a 6-transistor full-CMOS SRAM cell, for comparable device dimensions. The precise area savings will, of course, depend on the particular process and layout optimization being used, but a substantial area savings is available in any process.

A further advantage of the disclosed SRAM cell, and of the disclosed load element, is that the scaling is extremely favorable. As is well known to those in the integrated circuit art, the minimum dimensions of devices in mass production have been continually reduced, over a period of years, to achieve lower cost and greater functionality. To adapt existing device designs to reduced manufacturing dimensions, direct linear shrinkage is typically used. This process is known as "scaling". For example, one a process has been shown to be reliable, manufacturers may attempt to implement an "80% shrink," where all lateral dimensions in the device layout are simply multiplied by 0.8.

Although linear scaling is the ideal case, adjustments must be made in practice. For example, scaling of the vertical dimensions must often be adjusted. As lateral dimensions shrink, vertical dimensions (such as the depth of the source/drain junctions, the thickness of the gate oxide and thick field-isolation oxides, and the thicknesses of deposited layers) are normally also reduced, but this reduction is often not proportional to the lateral shrinkage. For example, the minimum thickness of the gate oxide will be limited by leakage and breakdown characteristics. Many device characteristics do not scale favorably to smaller dimensions. For example, metal lines tend to become slower: the resistance (per unit length) of a metal line scales approximately as the square of the scaling parameter, but its capacitance (per unit length) scales with an exponent which is slightly less that one (due to fringing field effects). Thus, an important criteria in selecting process features is scaling, since it is desirable not to design in a process feature which will soon have to be designed out again.

The present invention is particularly advantageous in its scaling behavior. The specific resistance of the vertical resistors provided is so high that one minimum-area (lambda$^2$) contact provides a current equal to the leakage current generated by active devices over an area of about one hundred to one thousand lambda$^2$. As the minimum dimension lambda is scaled, the area of the resistor will naturally scale in approximate proportion to the area of the circuit, and therefore the load current will track the leakage current over a wide scaling range.

Of course, if a higher or lower area-specific resistance (ohm-cm$^2$) is desired, the implantation dose may be changed. At higher doses the innovative load element exhibits a more linear relation of I to V. (At the doses used in the presently preferred embodiment, the disclosed load element has electrical characteristics which are rather nonlinear, as discussed below.)

A further advantage of the disclosed innovative process is that it does not introduce critical process steps, but merely takes advantage of an existing critical process step. Gate oxide growth is very critical in MOS processing, and a tremendous amount of engineering has been invested to achieve reliable processes for manufacturing thin gate oxide layers with very high quality and very low defects. The disclosed innovative load takes advantage of this engineering, and of the presence of these steps in a normal MOS process flow, to provide a new functionality without requiring additional process controls or any significant yield degradation.

A further novel and advantageous teaching is that high-impedance resistors, according to the present invention, can be combined with $V_{DD}$ power supply routing through a substrate diffusion. By routing power supply through a substrate diffusion, the high-impedance oxide resistors can be provided at the surface of this diffusion, where polysilicon lines make connection from the power supply voltage to the cell nodes. The load elements provided by the present invention are essentially no larger than the area which would be required for this contact any way, so that it may be seen that the area of the SRAM cell provided by the present invention is almost as small as that which would be required for a 4-transistor SRAM cell with no load element whatsoever (if such a thing were possible).

A further novel teaching provided by the present invention is an integrated circuit wherein a chain of high-impedance load elements as disclosed is used as a resistive divider network, to provide a high-impedance fully static reference voltage at a desired fraction of the supply voltage $V_{DD}$. Such a reference voltage is highly advantageous in many applications, since higher-power negative-feedback circuits can be turned on, when needed, to provide a low impedance output which tracks this high-impedance reference voltage.

In the presently preferred embodiment, the peripheral logic (which includes such conventional elements as address decoders, word line drivers, sense amplifiers, output buffers, write buffers, etc.) is full CMOS. Thus, PMOS devices are used to pull up the bit lines for precharge, although only passive load elements are used for pull-up in the cells.

A similar technique of combining high-impedance and low-impedance pull-ups can be used in random logic. Where it is simply necessary to maintain a node in a high state, or to assure that a node is not in an unknown state after having been inactive for some time, high-impedance load elements can advantageously be used. Where rapid low-to-high transitions are needed, PMOS pull-up devices would be used. For example, such a high-impedance load element could be used with a one-shot circuit which pulled up a node when a low-to-high transition was needed. For another example, such a high-impedance load can be used in open drain circuits, e.g. for wired-OR logic.

Another sample use of the high-impedance load to the present application is a a latching feedback element in logic circuits. For example, where two inverters are in series, the output of the second inverter could be fed back through a high-impedance load to the input of the first inverter. Since the load is so high-impedance, this load would not significantly retard the time required to switch the input to the first impedance. However, this feedback could provide enough current to maintain the first inverter in a known and stable state, until some other upstream active logic element applied a current to switch the first inverter.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment, wherein these innovative teachings are advantageously applied to the particular problems of low-power CMOS technology, and particularly to a low-power SRAM. However, it should be understood that this embodiment is only one example of the many advantageous uses of the innovative teachings herein. For example, the innovative load structure described herein can optionally be used in logic or analog circuits, as well as in SRAMs. In general statements made in the specification of the present application do not necessarily delimit any of the various claimed inventions. Moreover, some statements may apply to some inventive features but not to others.

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Figure 1:
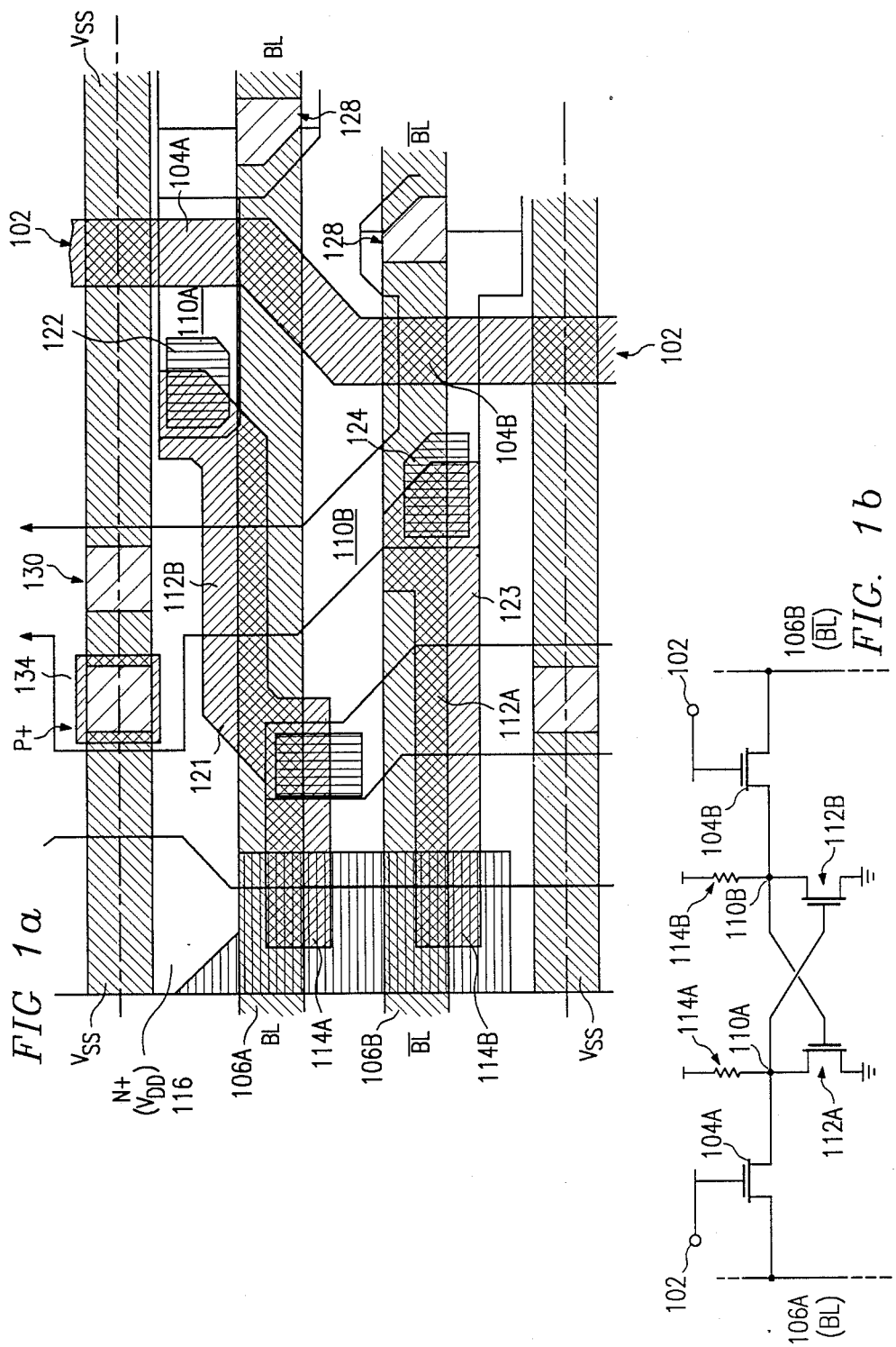
FIG. 1A schematically shows the layout of the SRAM cell of the presently preferred embodiment.
FIG. 1B shows a circuit diagram of the layout of FIG. 1.

FIG. 1B shows the circuit connections of the novel SRAM memory cell which is enabled by some of the innovative teachings of the present application. Electrically this cell resembles a conventional four-transistor SRAM cell, *except* that the load resistors 114 have a much higher impedance that has been normal in an NMOS SRAM. In the presently preferred embodiment, with a total cell area of about 125 square microns, the impedance of resistors 114 is in the neighborhood of 5 Teraohms ($5 \times 10^{12}$ ohms). For smaller cell dimensions, even higher effective resistance values can be used. When the wordline (not shown) is pulled high, to turn on NMOS pass transistors 104A and 104B, one of the two driver transistors 112A or 112B (whichever one is on, depending on the data stored in the cell) will sink current, through pass transistor 104A or 104B, from one of the bitline pair BL or BL-bar. As a result, the voltage on one of the bitlines begins to change. A sense amplifier senses the resulting voltage differential on the bitline pair, and provides a digital data signal accordingly. In the write mode, the desired data signal is driven onto the bitlines, and the pass transistors 104 are turned on to reset the state of the driver transistors 112.

The speed of an SRAM will be determined by many factors other than cell size, such as the speed and drive capability of drivers in the decoders, the word line drivers, and the sense amplifiers. These factors are all dependent on the relative dimensions given to various devices, as well as on the general process and minimum dimension used. The innovative teachings herein can be applied to a wide variety of NMOS and CMOS SRAM designs, including both high-speed and low-speed parts, to produce area savings without any degradation of speed. The cell parameters which affect the speed of the read operation are primarily the widths of the driver and pass transistors, and those widths can even be increased if desired. The write operation may be made slightly faster, since the high-impedance loads will source approximately no current to the low bitline during the write operation.

Figure 4:
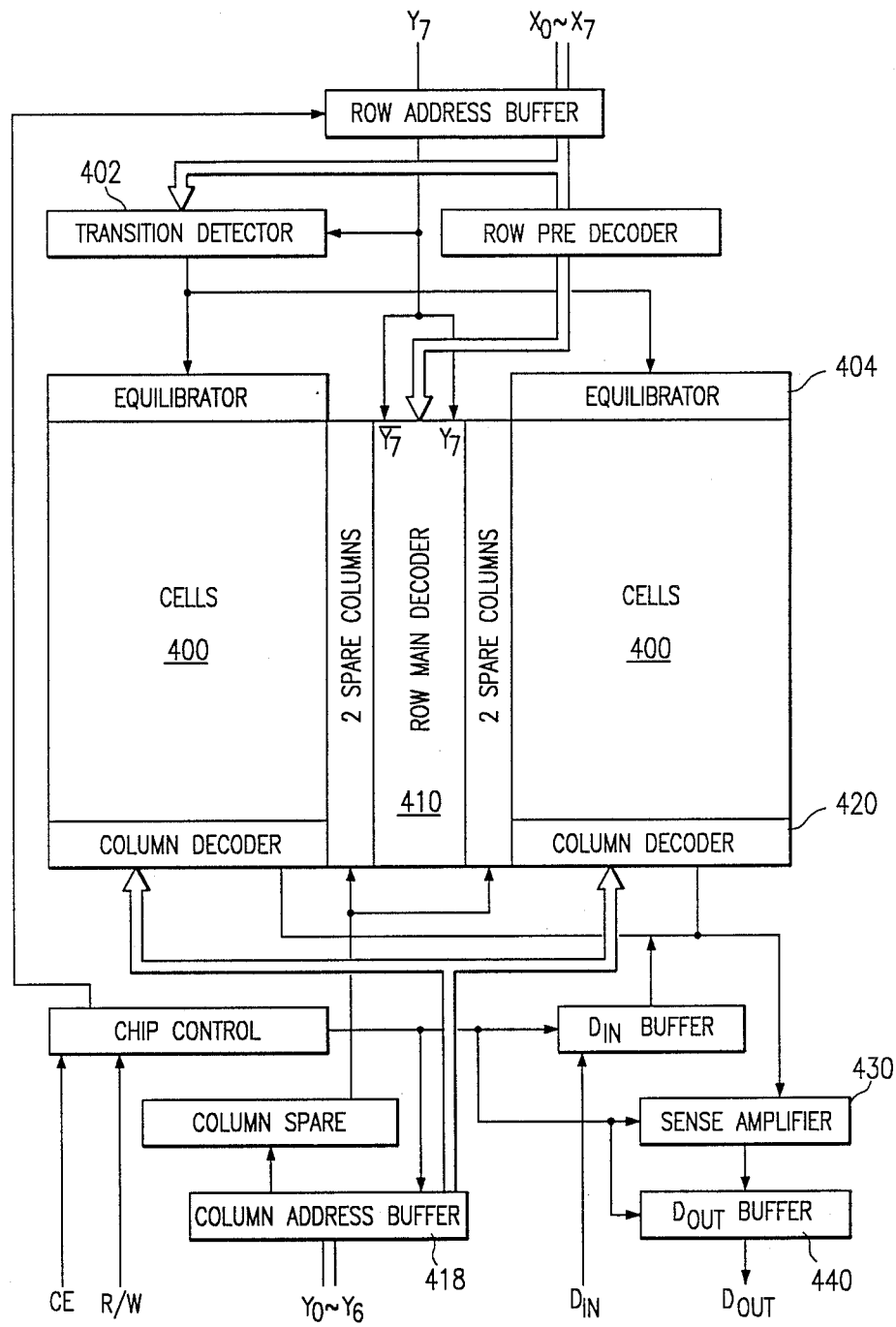
FIG. 4 shows an example of the architecture of an SRAM enabled by the present invention.

FIG. 4 shows the overall organization of one example of an SRAM integrated circuit provided by the present invention. The arrays 400 contain memory cells such as those shown in FIGS. 1A and 1B. Row address bits $X-X_7$ encode the row address of the cell to be accessed, and column address bits $Y_0-Y_7$ encode the column address of the cell to be accessed. When an address transition is detected by circuit 402, equilibrator circuits 404 precharge the bitline pairs. As soon as the new address has been decoded, one of the row decoders 410 drives the wordline of the selected row of cells.

Meanwhile, the column decoder 420, driven by data from the buffer 418, will multiplex the bitline pair of the selected column to sense amplifier 430. This then provides digital data signals to the data out buffer 440.

Of course, as will be readily recognized by those skilled in the art of memory design, a tremendous variety of architectural options exist. For example, multiple subarrays can be used, the array sizes can be varied, multiphase power-down control logic can be used, and other such modifications are well known.

FIG. 1A schematically shows the different as-patterned shapes of the thin films which would be overlaid, by a series of mask operations (which will be detailed below), to produce a functional integrated circuit.

FIG. 1A shows the layout of the presently preferred embodiment of the SRAM enabled by the present invention. This drawing schematically shows the different as-patterned shapes of the thin films which would be overlaid, by a series of mask operations (which will be detailed below), to produce a functional integrated circuit.

A polysilicon word line 102 runs across the rows of the memory cell array. This word line 102 gates pass transistors 104A and 104B. These two pass transistors connect to the pair of bit lines 106A and 106B (which are also referred to as BL and BL-bar) to the two nodes 110A and 110B. These nodes are cross-coupled. Driver transistor 112B has its gate line 121 connected (through buried contact 124) to node 110A. Similarly, the other driver transistor 112A has its gate line 123 connected, through buried contact 122, to node 110B. Thus, the cross-coupled transistor pair 112A and 112B provide a latch. However, note that the polysilicon lines 121 and 123, which are connected to the nodes 110A and 110B, respectively, are also connected, through a vertical-current-flow resistor area 114, to a heavily doped active device diffusion 116. The diffusion 116 is connected to the positive power supply $V_{DD}$. Thus, for example, in the state where driver transistor 110B is turned off, node 112B will be steadily pulled high, by the small current through resistor 114B, so that transistor 112A is held on and node 11A is held low (despite the very small current through resistor 114A). the cell can stay in this condition indefinitely. When a read operation is desired, the polysilicon word line 102 will be driven high, to turn on pass transistors 104A and 104B. This will connect the nodes 110A and 110B, respectively, to bit line 106A (BL) and bit line 106B (BL-bar). The metal bit lines make contact at ohmic contact locations 128. An additional contact 130 makes ohmic contact to the active device region which is accessed by driver transistor 112B. Note that the $V_{SS}$ supply line 132 is also connected, through an additional ohmic contact 134, to provide a contact to the p-type well, to prevent the potential of the well from floating.

The complete array of memory cells is defined by replicating a cell as shown (through mirror reflection on the top side and point reflection on the right side, in the orientation shown) to produce a block of four cells, which can then be replicated.

A sample process flow for fabricating this SRAM is as follows. This process flow is included to provide extremely clear disclosure of the best mode as presently practiced. However, it should be recognized that, as of the filing date of the present application, the following is not an established production process. As is well known to those skilled in the art of semiconductor manufacturing, processes may be extensively modified in the transfer to production. A tremendous variety of modifications could be made in the process flow, as will readily be recognized by those skilled in the art.

This sample process flow is as follows:

1. The starting wafer is a (100) oriented wafer doped 30 to 60 ohm-centimeters n-type. After clean-up, an initial oxide is grown to about 950 Ångstroms, and about 1,500 Ångstroms of silicon nitride is then deposited over the oxide. Photoresist is then deposited, and patterned according to the N-well pattern. Exposed portions of the nitride are then etched away by plasma etching, and phosphorus is implanted to dope the N-well. In this sample embodiment, phosphorous is implanted at 175 keV at a dosage of $8.5 \times 10^{12}$ cm$^{-2}$. A first field oxide is then grown to about 5,500 Ångstroms. (Note that this field oxide will grow generally in places which were exposed by the N-well mask, where phosphorous was implanted.) The remaining silicon nitride is then cleared, and boron is implanted to dope the P-well areas. (The first field oxide, which is thick over the N-well areas, will keep this implant out of the N-well areas.) In this sample embodiment, the P-well boron dose is $5.0 \times 10^{12}$ at 100 keV. A long high-temperature drive step will then be performed to drive in the N-well and P-well dopings (for example about 250 minutes at about 1150 degrees C.). The first field oxide is then stripped. This completes the formation of the N-well and P-well regions, in which the PMOS and NMOS active devices (respectively) will be formed.

Figure 3:
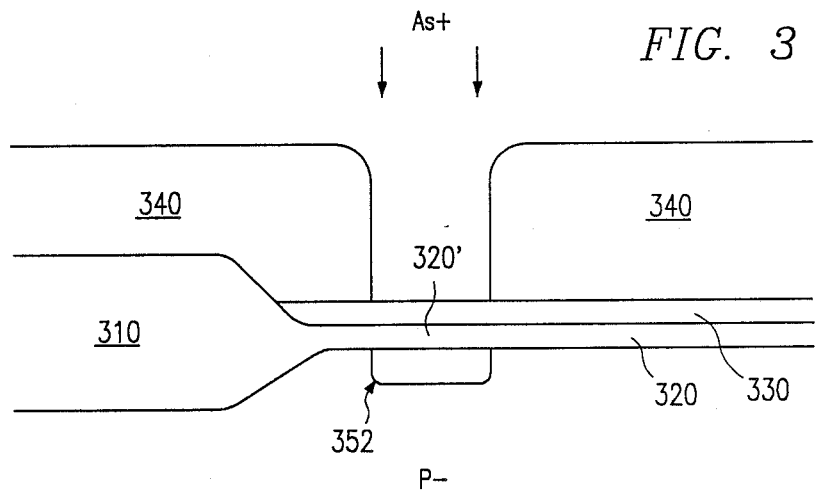
FIG. 3 shows a section of an integrated circuit device with load elements, according to the present invention, during the process of fabrication.

2. The active device areas will now be fabricated. First, a pad oxide is grown, to about 600 Ångstroms, and nitride is deposited, to about 1,500 Ångstroms. Photoresist is deposited and patterned, so that the areas where active devices will be desired are covered, and remaining areas are exposed. A plasma etch is now used to strip the nitride from these areas. The photoresist is now stripped, and another layer of photoresist is deposited and patterned to expose only the regions where channel stops for the NMOS devices are desired. Boron is now implanted, e.g. at 30 keV at a dosage of $1.1 \times 10^{14}$ per centimeter squared, and the photoresist is then stripped. A high temperature oxidation is now performed, to grow oxide to a thickness of about 5,900 Ångstroms. (This is the field isolation oxide 310, seen in FIG. 3.) A plasma etch now removes the remaining silicon nitride portions.

3. The next steps form the active devices and the high-impedance resistors.

A sacrificial gate oxide is now grown to a thickness of about 350 Ångstroms. A blanket implant is now performed to adjust the threshold voltages of the active devices. In the presently preferred embodiment, this $V_T$-adjust implant is 20 keV Boron at a dosage of $3.0 \times 10^{12}$ per centimeter squared. The sacrificial oxide is now stripped.

The slice is again cleaned up, and the final gate oxide 320 (seen in FIG. 3) is grown. In the presently preferred embodiment, this oxide is grown to 225 ±25 Ångstroms, at a temperature of 950 degrees C. in a dry atmosphere which includes argon, oxygen, and a chlorinating agent such as TCA.

A thin polysilicon capping layer 330 (seen in FIG. 3) is now deposited over the gate oxide. In the presently preferred embodiment, this polysilicon is deposited to 500±25 Ångstroms. After this thin polysilicon layer 330 is deposited, a brief phosphorus diffusion is preferably performed. In the presently preferred embodiment, this is performed using POCl$_3$. This achieves a final sheet resistance in the polysilicon capping layer of about 25 ohms per square.

Another photoresist layer (shown as photoresist layer 340 in FIG. 3) is deposited, and is patterned to expose areas where the oxide resistor is desired. Arsenic is now implanted to form the doped oxide film 320' in desired locations. Where the thickness parameters are as given above, arsenic is implanted with an energy of 100 keV. The dosage is preferably in the range of from about $5 \times 10^{15}$ cm$^{-3}$ to about $1.2 \times 10^{16}$ per square centimeter. (Optionally, the implant dose can be adjusted at this stage, to compensate for any deviation in the actual measured thickness of the gate oxide actually grown.) (In a further alternative embodiment, an additional light phosphorus implant (e.g. $3 \times 10^{13}$ per centimeter squared at 100 keV) can be added as a backing implant. This assures that the junction 352 in the substrate, which results from the tail from the arsenic implant which is used to dope the oxide, will not be too abrupt.) The resist is then ashed and stripped. (The first polysilicon layer 330 will remain in place, to protect the resistor oxide 320' from contaminants and harsh atmospheres in subsequent processing steps (e.g. in the asher.))

Another layer of photoresist is now applied and patterned, to expose areas where buried contacts are desired to be formed. (Buried contacts are contacts which are formed directly between a polysilicon layer and the substrate in an active device area.) A brief polysilicon etch, and a very brief oxide etch, are now performed to expose the substrate in buried contact areas. An arsenic implant is now performed to dope the buried contact areas, e.g. at 50 keV with a dose of $5.0 \times 10^{14}$ per square centimeter. The resist is now ashed and stripped.

A second polysilicon deposition, which contains the bulk of the polysilicon layer thickness, is now performed. The thickness of this second deposition is preferably about 4,000 Ångstroms. This second deposition will make contact to the first thin polysilicon layer, and will also make contact directly to the substrate at the buried contact locations.

The polysilicon layer will now be phosphorus doped (e.g. by $POCl_3$ deposition), to a net sheet resistance of about 10 ohms per square. After clean-up, photoresist is deposited and patterned to expose the area where the polysilicon layer is desired to be removed. A short oxide etch is applied, to clear native oxide from the exposed areas of polysilicon, and a silicon etch is then performed to clear the polysilicon from the undesired areas. The photoresist is then removed. A short oxidation is now performed, to passivate the exposed surfaces of the polysilicon layer. The remainder of the active device fabrication steps are entirely conventional, e.g. formation of N+ and P+ source/drain regions by separate masked implantation steps.

4. The foregoing steps essentially complete the formation of the active devices. The remaining steps are primarily directed to interconnect and hermeticity.

An interlevel oxide is now formed, e.g. by depositing 4500 Ångstroms of doped silicate glass (e.g. phosphosilicate glass). This interlevel oxide is then densified and reflowed, to provide a cleaner surface for subsequent steps.

Another level of photoresist is now deposited and patterned, to expose locations where contacts are desired to be formed. A long oxide etch is now performed, to etch down to the substrate at contact locations. The photoresist is then stripped.

The metal layer will now be formed. In the presently preferred embodiment, 8,000 Ångstroms of aluminum alloy is deposited, patterned, and etched, to provide metal connecting lines in a desired pattern.

Protective overcoat deposition and bond pad etch can the be performed according to conventional technology, to complete fabrication of the device.

Of course, the foregoing process flow is merely illustrative, and can be widely modified and varied. For example, if it is desired not to use buried contacts, TiN local interconnects could be used instead, or both buried contacts and local interconnects could be omitted. The use of the preliminary polysilicon capping layer facilitates the use of buried contacts with the present invention, since this layer contributes to the successful fabrication of buried contacts as well as to the fabrication of high-impedance loads according to the present invention, but this is certainly not a necessary feature of the invention.

Test devices have been fabricated to demonstrate the disclosed innovative load structure. Following is a table of measured values of current for resistors of this kind. These sample devices were fabricated using an arsenic implanted dose of $1.4 \times 10^{16}$ cm$^{-2}$.

| Site | Voltage | Temperature | Background Leakage | Per Cell |
|---|---|---|---|---|
| 1 | 3 | 25° C. | .25 pA | 5.48 fA |
|   | 5 | 25° C. | .30 pA | 51.80 fA |
|   | 3 | 80° C. | .50 pA | 986.00 fA |
|   | 5 | 80° C. | .90 pA | 3.99 pA |
| 2 | 3 | 25° C. | .55 pA | 7.68 fA |
|   | 5 | 25° C. | .25 pA | 203.10 fA |
|   | 3 | 80° C. | .85 pA | 1.57 pA |
|   | 5 | 80° C. | .30 pA | 6.50 pA |
| 3 | 3 | 25° C. | 0 pA | 85.90 fA |
|   | 5 | 25° C. | .40 pA | 2.83 pA |
|   | 3 | 80° C. | .15 pA | 5.662 pA |
|   | 5 | 80° C. | .35 pA | 11.18 pA |
|   | 3 | 40° C. | .50 pA | 244.30 fA |
|   | 5 | 40° C. | .55 pA | 4.882 p |
| 4 | 3 | 25° C. | .20 pA | 12.70 fA |
|   | 5 | 25° C. | .20 pA | 371.00 fA |
|   | 3 | 80° C. | .50 pA | 586.40 fA |
|   | 5 | 80° C. | .65 pA | 2.00 pA |
| 5 | 3 | 25° C. | .35 pA | 330.00 fA |
|   | 5 | 25° C. | .90 pA | 6.00 pA |
|   | 3 | 80° C. | .15 pA | 8.21 pA |
|   | 5 | 80° C. | .15 pA | 12.41 pA |
|   | 3 | 40° C. | .60 pA | 755.30 fA |
|   | 5 | 40° C. | .60 pA | 8.175 pA |

These measurements were made with the positive supply voltage $V_{DD}$ connected to the substrate. If it is desired to avoid any asymmetric (rectifying) characteristics, a further alternative teaching of the present application is that load elements can be connected back to back to connecting them into a diffusion in a common active device area.

Note that the measured resistances are highly nonlinear with temperature. If we model $I = I_0 \exp(C_t(T - T_0))$, for measurements of current 3 V at 25 C, and 80 C, then $C_t$ ranges from 0.055 up to 0.097.

At doses above $2 \times 10^{16}$ cm$^{-2}$, the behavior begins to change significantly. For a dose of $5 \times 10^{16}$ cm$^{-2}$, the area-specific resistance was found to be about 120 kilohm-micron$^2$. Moreover, the resistance of these heavily implanted devices also exhibits much more linear temperature dependence and I-V characteristics. If the dose is increased to $1 \times 10^{17}$ cm$^{-2}$, the area-specific resistance was found to have decreased only to about 100 kilohm-micron$^2$. At doses of $2 \times 10^{16}$ cm$^{-2}$, the behavior of the resistors appeared to be very widely scattered: some exhibited linear dependence on temperature, and some exhibite exponential dependence. For the SRAM cell described above, doses in the neighborhood of about $5 \times 10^{15}$ cm$^{-2}$ have been found to be effective.

A dose of about $5 \times 10^{15}$ cm$^{-2}$ produces an as-implanted concentration, in the oxide, of slightly more than $1 \times 10^{21}$ cm$^{-3}$. After process steps which include high-temperature steps equivalent to about an hour at 975 C., the peak concentration of dopant in the oxide is estimated to be about $1 \times 10^{21}$ cm$^{-3}$, with some fall-off of concentration at the upper and lower interfaces.

The measured current through the test samples may be translated into familiar resistance parameters. (In view of the nonlinearities referred to above, it should be noted that these are equivalent parameters at 25 C at 3 V applied. Different values would be calculated at other voltages or temperatures.) For square resistors of 1.2 microns on a side, the measured current (at 3 V and 25 C) corresponds to a resistance of about 30 to 35 Teraohms. This corresponds to an area-specific resistance of about 50 Teraohm-micron$^2$. (Other samples tested had values for this parameter, of as high as 788 Teraohm-micron$^2$ and as low as 13 Teraohm-micron$^2$.) For the 225 Ångstrom film tested, the equivalent bulk resistivity was about 220 Gigaohm-cm. (Other samples tested had values, for this parameter, of as high as 3500 Gigaohm-cm and as low as 58 Gigaohm-cm.)

Figure 2:
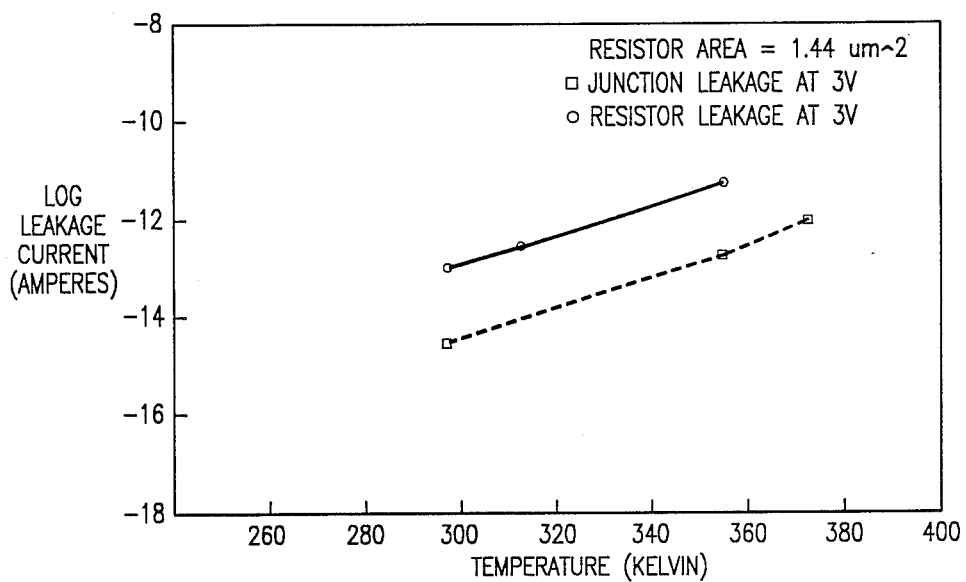
FIG. 2 shows the temperature dependence of the resistor of the presently preferred embodiment, as compared to the temperature dependence of substrate leakage current.

FIG. 2 is a graph showing the temperature dependence of current through a sample load element according to the present invention (data points shown as circles), and also showing the temperature dependence of leakage current (data points shown as squares). Note that the temperature dependence of the two curves is almost identical. (Note that this is a logarithmic plot, showing exponential behavior of current.) As noted above, this correspondence is very advantageous. The specific values shown are for a resistor of 1.44 square microns.

As will be recognized by those skilled in the art, the innovative concepts described in the present application can be modified and varied over a tremendous range of applications, and accordingly their scope is not limited except by the allowed claims.

For one example, other dopant species could be substituted for arsenic. Arsenic has the advantages of short stoping distance and relatively low diffusivity. Moreover, since arsenic is such a heavy ion, it provides large momentum-transfer effects in the oxide, since the incoming arsenic atoms will disturb many of the silicon and oxygen atoms in place.

One possible substitution is antimony, which also has the advantages of high mass and low diffusivity. However, alternatively (and less preferably) other species could be used, such as gallium or phosphorus.

Another alternative is the use of implanted oxynitrides. Many processes use oxynitrides ($SiO_2/Si_3N_4$ mixtures) for gate dielectrics, and processes with such oxynitrides can also (less preferably) be adapted for use with the present invention. Silicon nitride generally tends to be a somewhat "tougher" dielectric, with a shorter stopping distance for implants than silicon dioxide.

A further advantage of the disclosed load element is that the lateral spacing of such load elements is not at all critical, and is determined entirely by the spacing of top conductor.

What is claimed is:

1. A process for making an integrated circuit, comprising the steps of:
   (a) providing a substrate including monocrystalline semiconductor portions therein;
   (b) forming a high-quality thin dielectric film on said monocrystalline semiconductor portions;
   (c) covering said thin dielectric film with a thin capping layer;
   (d) introducing dopant atoms into a predetermined area portion of said thin dielectric film, to induce a significantly increased leakage current therein;
   (e) providing a gate layer over said capping layer, said gate layer being a thin film conductive layer which is patterned to form the gate electrode of multiple operable insulated-gate field-effect transistors in predetermined locations, other portions of said high-quality thin dielectric film providing the gate dielectric of said transistors, and said monocrystalline semiconductor portions providing the channel of at least some of said transistors; and
   (f) interconnecting one of said transistors in circuit paths to implement a desired electrical function, wherein some of said circuit paths include current flowing vertically through said increased-leakage-current portions of said high-quality thin film to provide electrical load elements.

2. The process of claim 1 wherein said step (b) grows a film consisting essentially of silicon dioxide.

3. The process of claim 1, wherein said step (b) is performed at a temperature of about 950 degrees C.

4. The process of claim 1, wherein said step (c) is performed in a dry atmosphere which includes oxygen and a chlorinating agent.

5. The process of claim 1, wherein said step (b) grows a film consisting essentially of silicon dioxide, and having a thickness in the range of about 225 Angstroms.

6. The process of claim 1, wherein said step (b) grows a film consisting of silicon dioxide.

7. The process of claim 1, further comprising an additional step of growing and removing a sacrificial layer of silicon dioxide, prior to said step (b).

8. The process of claim 1, wherein said step (b) grows a film comprising silicon oxynitride.

9. The process of claim 1, wherein said step (b) grows a film comprising a multilayered dielectric.

10. The process of claim 1, wherein said step (b) grows a film comprising a multilayered dielectric, and at least one layer of said film consists essentially of silicon dioxide.

11. The process of claim 1, wherein said thin dielectric film comprises a silicon oxynitride, and has an oxygen:nitrogen atomic ratio of at least 4:1.

12. The process of claim 1, wherein said step (d) of introducing dopant atoms is performed by implantation, with a dosage and energy which provides a maximum concentration of dopant species in said thin dielectric film which is less than about $3 \times 10^{21}$ cm$^{-3}$.

13. The process of claim 1, wherein said step (d) of introducing dopant atoms is performed by implantation, with a dosage and energy which provides an average concentration of dopant species in said thin dielectric film which is in the range of about $10^{19}$ to $10^{22}$ cm$^{-3}$ inclusive.

14. The process of claim 1, wherein said step (d) of introducing dopant atoms is performed by implantation, with a dosage and energy which provides an average concentration of dopant species in said thin dielectric film which is greater than about $5 \times 10^{20}$ cm$^{-3}$.

15. The process of claim 1, wherein said step (d) of introducing dopant atoms is performed by implantation, with an area-specific dosage which is less than about $2 \times 10^{16}$ cm$^{-2}$.

16. The process of claim 1, wherein said step (d) of introducing dopant atoms is performed by implantation of a species selected from the group consisting of arsenic, antimony, and gallium.

17. The process of claim 1, wherein said step (d) of introducing dopant atoms is performed by implantation with an area-specific dosage which is in the range of about $2 \times 10^{15}$ cm$^{-2}$ to about $1 \times 10^{16}$ cm$^{-2}$.

18. The process of claim 1, wherein said step (d) of introducing dopants is performed by implantation with a dosage and energy which causes said thin dielectric film to have a bulk resistivity (as determined for electric fields of about 150 Volts per micron, and for temperatures in the neighborhood of 25 C.) in the range of 30–10,000 Gigaohm-cm.

19. The process of claim 1, wherein said step (d) of introducing dopants is performed by implantation with a dosage and energy which causes said thin dielectric film to have a bulk resistivity (as determined for electric fields of about 150 Volts per micron, and for temperatures in the neighborhood of 25 C.) which is less than 10 Teraohm-cm.

20. The process of claim 1, wherein said step (d) of introducing dopants is performed by implantation of arsenic, followed by implantation of phosphorus.

21. The process of claim 1, wherein said step (d) of introducing dopants is performed by implantation of two different species separately.

22. The process of claim 1, further comprising the additional step, after said step (d) and before said step (e), of etching buried contact holes in said thin dielectric film at predetermined locations.

23. The process of claim 1, wherein said step (c) deposits said capping layer to a thickness of about 500 Angstroms.

24. The process of claim 1, wherein, during said step (d), said capping layer is deposited as undoped polysilicon, and then doped.

25. The process of claim 1, wherein said step (e) provides said gate layer to a thickness of about 4,000 Angstroms.

26. A process for making an integrated circuit, comprising the steps of:
providing a substrate including therein monocrystalline semiconductor portions, consisting predominantly of silicon;
growing a high-quality thin dielectric film, consisting predominantly of silicon dioxide, on said monocrystalline semiconductor portions;
covering said thin dielectric film with a thin capping layer, said capping layer being polycrystalline and consisting predominantly of silicon;
implanting impurities into a predetermined area portion of said thin dielectric film, to induce a significantly increased leakage current therein;
providing a gate layer over said capping layer, said gate layer being a thin film conductive layer which is patterned to form the gate electrode of multiple operable insulated-gate field-effect transistors in predetermined locations, other portions of said high-quality thin dielectric film providing the gate dielectric of said transistors, and said monocrystalline semiconductor portions providing the channel of at least some of said transistors;
and interconnecting ones of said transistors in circuit paths to implement a desired electrical function, wherein some of said circuit paths include current flowing vertically through said increased-leakage-current portions of said high-quality thin film to provide electrical load elements.

27. A process for making a CMOS integrated-circuit comprising the steps of:
(a) providing a body including extended portions of monocrystalline semiconductor material, and including P-type well regions extending to the surface of said body in some respective locations, and N-type regions of said monocrystalline material extending to the surface of said body in other respective locations;
(b) forming field isolation regions, said isolation regions defining a plurality of active device regions which are separated from each other by portions of said field isolation regions;
(c) growing a high-quality thin dielectric film on said monocrystalline semiconductor portions;
(d) covering said thin dielectric film with a thin capping layer;
(e) implanting impurities into a predetermined area portion of said thin dielectric film, to induce a significantly increased leakage current therein;
(f) providing a gate layer over said capping layer, said gate layer being a thin film conductive layer being patterned to form the gate electrode of multiple operable N-channel insulated-gate field-effect transistors in predetermined locations within said P-type well regions, and of multiple operable P-channel insulated-gate field-effect transitors in predetermined locations within said N-type well regions;
(g) introducing a heavy concentration of P-type dopants, with a relatively short stopping distance, into locations of said P-channel transistors; and introducing a heavy concentration of N-type dopants, with a relatively short stopping distance, into locations of said N-channel transistors; and
(h) providing at least one pattered thin-film metal layer, which is configured to interconnect one of said transistors in circuit paths to implement a desired electrical function.

* * * * *